United States Patent [19]

Wicklund, Jr.

[11] 4,065,724
[45] Dec. 27, 1977

[54] BALANCED LOW IMPEDANCE DIFFERENTIAL INPUT LINE PREAMPLIFIER

[75] Inventor: Joseph B. Wicklund, Jr., Bothell, Wash.

[73] Assignee: Opcon, Inc., Everett, Wash.

[21] Appl. No.: 710,626

[22] Filed: Aug. 2, 1976

Related U.S. Application Data

[62] Division of Ser. No. 608,664, Aug. 28, 1975, Pat. No. 4,015,117.

[51] Int. Cl.² .............................................. H03F 3/45
[52] U.S. Cl. ..................................... 330/252; 330/311
[58] Field of Search .................... 330/20, 30 D, 30 R, 330/69

[56] References Cited

U.S. PATENT DOCUMENTS

| 3,541,465 | 11/1970 | Nagata et al. | 330/30 D |
| 3,624,533 | 11/1971 | Schiff | 330/69 X |
| 3,760,194 | 9/1973 | Lutz et al. | 330/30 D X |
| 3,895,307 | 7/1975 | Furuhashi | 330/30 D X |

Primary Examiner—James B. Mullins
Attorney, Agent, or Firm—Christensen, O'Connor, Garrison & Havelka

[57] ABSTRACT

A balanced low impedance differential input line preamplifier comprising a differential amplifier and a pair of high gain common base input stages. The input signal is directly applied to the emitters of the common base input stages and the collectors of the common base input stages are each connected to one input of the differential amplifier. Capacitors are used to DC decouple the common base input stages to the differential amplifier.

4 Claims, 5 Drawing Figures

BALANCED LOW IMPEDANCE DIFFERENTIAL INPUT LINE PREAMPLIFIER

This is a divisional of application Ser. No. 608,664, filed Aug. 28, 1975 and now U.S. Pat. No. 4,015,117

BACKGROUND OF THE INVENTION

This invention is directed to photosensing systems and, more particularly, to modulated photosensing systems.

Since the advent of solid-state light emitting diodes (LEDs), which are relatively easily modulated by solid-state electronic systems, modulated photoelectric control systems have come into widespread use. Modulated photoelectric control systems, in general, are systems wherein one or more light sensing devices are used to sense the position or nature of one or more objects and, in accordance therewith, control the function of a machine. For example, in a simplified system, a light sensing device may be positioned so as to sense when an object, moved by a conveyor, reaches a particular position, position sensing being accomplished when the object prevents light from a light source impinging on the light sensing device. When this position is reached, the overall photoelectric control system may cause a cutting device to be energized, and the object cut. Alternatively, two light sensing devices can be used to form a smoke detector. In such an embodiment, one light sensing device receives light through a closed system (e.g., light pipe) and the other receives light passing through the atmosphere. A comparison of the outputs of the two light sensing devices provides an indication of the existence of smoke in the atmosphere through which the second light passes.

While the use of modulated photoelectric control systems have become fairly widespread in machine tool and related environments because of their greater useful sensitivity and light immunity characteristics when compared with unmodulated, photoelectric devices, certain disadvantages have made them unuseful in certain environments. For example, the use of remotely located modulated LEDs and their related photosensors has been very limited because of the inability of electronic systems to reliably detect the photosensor's signal. That is, in the past, modulated photosensor outputs connected to a detector via a cable in excess of several feet long have been reduced by cable capacitance to the point where they have become lost in the noise picked by the cable and, thus, undetectable conventional amplification and detection circuits. These signals have become undetectable because prior art detectors have, even when balanced, had unacceptably high input impedances.

More specifically, the maximum allowable cable length is inversely proportional to cable capacitance per unit length, the input impedance of the line preamplifier and the operating frequency. Mathematically, these terms can be related by the following formula:

$$L_{MAX} = (K/2\pi FRC)$$

where:

$L_{MAX}$ = the maximum cable length;
F = the modulation frequency;
R = the input impedance of the preamplifier;
C = the cable capacitance per unit length; and
K = a constant of proportionality dependent on the allowable level of single degradation.

In a typical photoelectric system, F = 15 KHz; R = 10,000 ohms; C = 70pF/foot; and K = 1.0. For such a system, $L_{MAX}$ is calculated to be 15 feet. If, however, R can be reduced to 1000 ohms, then $L_{MAX}$ becomes 150 feet without any additional signal attenuation occurring. While $L_{MAX}$ can also be increased by lowering the modulation frequency, such lowering results in longer response times and less immunity to standard artificial light. Alternatively, K can be increased, but at the expense of greatly added cost or reduction in system performance. Thus, these latter two solutions are generally considered to be unsatisfactory.

The prior art has attempted to solve the foregoing problem by amplifying the photosensor outputs prior to applying them to the input end of relatively long cables. While this solution is somewhat satisfactory, it has the obvious disadvantage that it increases the size, complexity and cost of the portion of the system related to the production of the photosensor signals. Moreover, amplifiers require power either from a locally located battery or via cables connected to a remote supply; hence the photosensor signal production system becomes an active rather than a passive system, and acquires all of the disadvantages that an active system has over a passive system.

Therefore, it is an object of this invention to provide new and improved modulated photosensing systems.

It is a further object of this invention to provide a modulated photosensing system wherein the output of a photosensor directly connected to one end of a relatively long cable, i.e., one in excess of several feet, is detectable at the other end of the cable.

It is a still further object of this invention to provide a new and improved unbiased modulated photosensing system that includes a low input impedance detector suitable for detecting an unamplified photosensor signal applied to one end of a relatively long cable.

It is a yet another object of this invention to provide a new and improved low input impedance detector suitable for detecting relatively low level signals applied to a relatively long cable.

While modulated photoelectric control systems have a number of advantages over unmodulated photoelectric control systems, in the past, unmodulated photoelectric control systems have retained other advantages. The primary retained advantage has been their ability to directly connect photosensors in series or parallel to perform certain comparing and simple logic-type functions. More specifically, while pulse modulated control systems have proven to have superior sensitivity and light immunity characteristics, in the past, their outputs have not been directly combined (prior to amplification and/or transmission) to perform certain comparing and logic-type functions. For example, their outputs have not been directly combined to provide a comparison smoke detector of the type generally described above.

Therefore, it is yet another object of this invention to provide modulated photosensing systems wherein the outputs of more than one modulated photosensor are directly combined together.

It is a still further object of this invention to provide unbiased modulated photosensing systems suitable for performing certain comparing and logic-type functions by directly combining the outputs of a plurality of modulated photosensors. i.e., combining them without electronically changing them into a binary logic form.

It is a more comprehensive object of this invention to provide modulated photosensing systems adapted to directly perform comparing and logic-type functions and transmit the result over cable lengths in excess of several feet and to provide a low input impedance detector suitable for detecting the low-level logic signals applied to cables of such lengths.

SUMMARY OF THE INVENTION

In accordance with principles of this invention, the output of an unbiased photovoltaic device, mounted to receive light generated by a modulated light source and perform the function of a photosensor, is connected via a cable to an input line preamplifier having low input impedance and good common mode rejection. The photovoltaic device may take on various forms, but preferably comprises an unbiased photodiode or phototransistor connected as a photodiode operating in the photovoltaic mode.

In accordance with further principles of this invention, the input line preamplifier is a novel balanced low impedance differential input line preamplifier comprising a differential amplifier and a pair of common base input stages. One common base input stage is connected to one wire of the cable connected to the photovoltaic device and the other common base input stage is connected to the other wire connected to the photovoltaic device. The outputs of the common base input stages are connected to the two inputs of the differential amplifier.

In accordance with further principles of this invention, two or more unbiased photovoltaic devices are directly connected in circuit with one another and positioned so as to receive modulated light from a suitable source (or sources), such as a light emitting diode (LED). The plural photovoltaic devices are connected together such that their combined output represents a predetermined comparison or logic-type function. The output may, for example, represent an Exclusive OR or OR function. Alternatively, it may provide an indication of the existance of smoke or some other semi-opaque object located in the light beam received by one or more of the photovoltaic devices. The combined signal output may be connected to the input of the balanced low impedance differential input line preamplifier of the invention via a cable in excess of several feet, if desired.

It will be appreciated from the foregoing brief summary that the invention has a number of aspects adapted to overcome the prior art problems discussed above. First, the inclusion of a novel balanced low impedance differential input line preamplifier results in the provision of a system adapted to detect the output of one or more photovoltaic devices over relatively long cable lengths. This result is accomplished because the balanced low impedance differential input line preamplifier of the invention formed of a differential amplifier and a pair of common base input stages has very low input impedance (below 1000 ohms) and good common mode rejection (greater than 40 db). For example, the low input impedance may be 750 ohms. In such a case, using the foregoing formula, $L_{MAX}$ is 200 feet, K, F and C remaining the same. A second aspect of the invention is the combination of a plurality of unbiased photovoltaic devices directly connected together and mounted to receive modulated light. Such a combination provides a combined output containing information about a particular condition (e.g., the existance of smoke) or representing a simple logic-type function (e.g., an OR function), whether or not connected to a detector via a long cable. A still further aspect of the invention is the provision of a detector for detecting the relatively low level signals generated by such combinations at the end of a relatively long cable, e.g., in excess of several feet. Because the invention provides for the detection of relatively low level signals at the ends of relatively long cables, it eliminates the prior art long cable requirement that amplifiers be located near the light sensors. Hence, an overall system incorporating the invention is substantially less expensive than prior art systems adapted to perform the same general functions. Moreover, the directly combined output aspect of the invention, performed by unbiased, modulated photovoltaic devices, is a unique aspect in and of itself. Similarly, the balanced low impedance differential input line preamplifier is separately novel, and is useful in other systems, primarily those wherein noise and cable capacitance tend to limit signal detection from a current source type of sensor.

DESCRIPTION OF THE PREFERRED EMBODIMENT

The foregoing object and many of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

Figure 1:
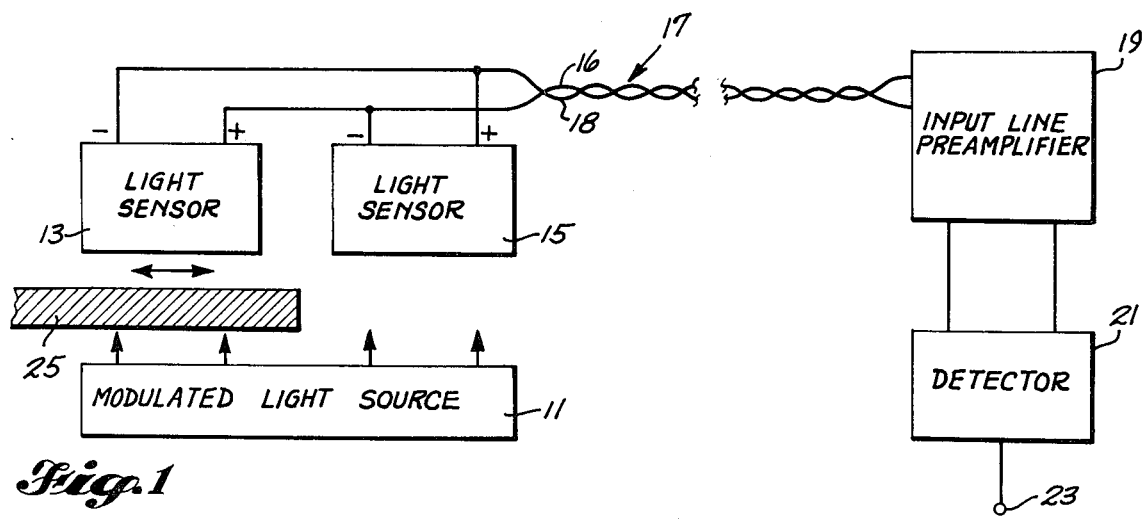
FIG. 1 is a block diagram illustrating a pair of ight sensors (photovoltaic devices) directly connected together in a reverse polarity, parallel arrangement, the combined output being transmitted result via a relatively long cable to an input line preamplifier, preferably formed in accordance with the invention.

Turning now to the drawings, FIG. 1 illustrates a photosensing system formed in accordance with the invention and comprises: a modulated light source 11; first and second light sensors 13 and 15; a cable 17; an input line preamplifier 19; and, a detector 21. The light sensors are photovoltaic devices, such as unbiased photodiodes or phototransistors connected as a photodiode operating in the photovoltaic mode. Thus, while phototransistors are preferred, other semiconductor devices having a photovoltaic mode of operation and adapted to receive light from a modulated light source can be utilized, if desired. The modulated light source comprises one or more modulated light emitting elements, such as light emitting diodes (LEDs) connected to a suitable modulated energy source, well known to those skilled in the art. The light sensors are spaced from, and mounted such that, their photosensitive surfaces receive light generated by the modulated light source.

The cable 17 is illustrated as comprising a twisted pair of wires 16 and 18. One end of one of the wires, 18, is connected to the negative terminal of the first light sensor 13 and the positive terminal of the second light sensor 15. The associated end of the other wire, 16, is connected to the positive terminal of the first light sensor 13 and the negative terminal of the second light sensor 15. The other ends of the twisted wire pair are connected to the input terminals of the input line preamplifier 19. The output of the input line preamplifier 19 is connected to the input of the detector 21. The output of the detector 21 is connected to an output terminal 23.

Also illustrated in FIG. 1 is an opaque object 25 that is movable to a position whereat it prevents light from the modulated light source 11 impinging on neither one, or both, of the light sensors 13 and 15. Because the outputs of the light sensors 13 and 15 are reverse wired (with respect to one another) to the input end of the cable 17, the photosensing system illustrated in FIG. 1 performs an Exclusive OR logic-type (difference) function. That is, if either, but not both, of the light sensors 13 or 15 is receiving light, the light sensor receiving light applies an output voltage to the cable 17. If neither light sensor, or both light sensors, are receiving light from the modulated light source 11, zero voltage is applied to the cable 17. In the first of these latter situations, i.e., the one where neither light sensor is receiving light, neither light sensor generates an output voltage and, thus, none is applied to the cable 17. In the second of these latter situations, i.e., the one where both light sensors are receiving light from the modulated light source 11, their outputs, due to the reverse wiring connection, cancel and, thus, zero voltage (except for minor differences in the light sensors voltage producing capability) is applied to the cable 17.

As an alternative, the structure illustrated in FIG. 1 could be used to perform other functions that are not necessarily true logic-type functions. For example, if the object 25 were translucent, for example, a light pipe, fixed in position, the structure could perform the function of a smoke detector. That is, smoke (or more generally, any opaque or semi-opaque object, liquid or gas) would reduce the intensity of the light beam received by the second light sensor 15 if located between the modulated light source 11 and the second light sensor 15. The reduction in received light intensity would be reflected in the combined output of the two light sensors. In other words, the first light sensor 13 would act as a reference and the second light sensor would act as a smoke detector whereby the overall system performs a comparisonfunction.

The input line preamplifier is, preferably, a balanced low impedance differential input line preamplifier formed in the manner hereinafter described. The input preamplifier senses the presence or absence of a light sensor generated voltage and, in accordance therewith, applies (or does not apply) a signal to the detector 21. The detector, in turn, generates an output signal at the output terminal 23 that denotes the receipt or nonreceipt of a light sensor generated voltage. While the input line preamplifier is, preferably, formed in accordance with the present invention, other preamplifiers and detectors may be utilized if they meet the criteria of the invention, i.e., have low input impedance (1000 ohms or below) and good common mode rejection (40db or greater).

Figure 2:
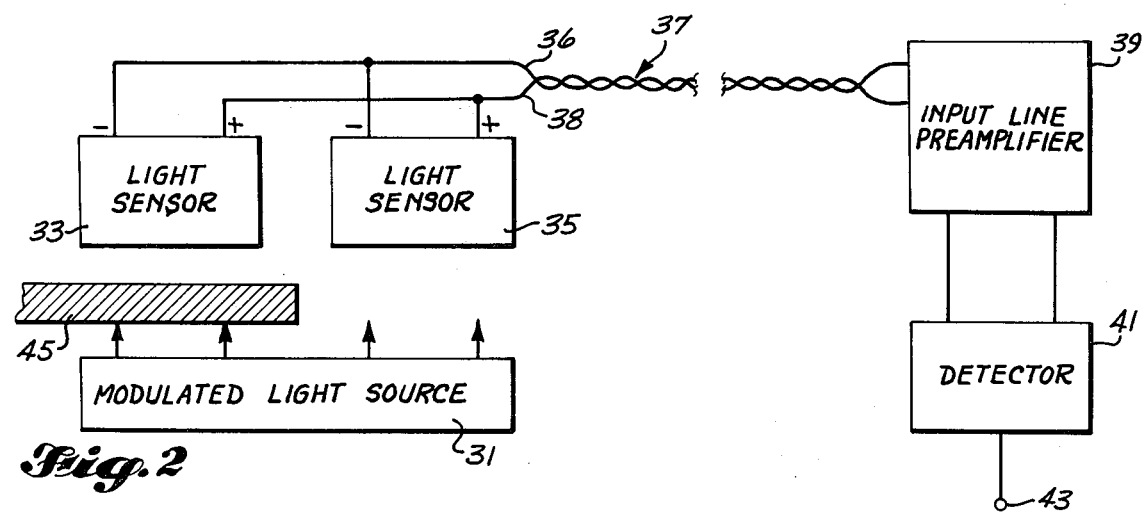
FIG. 2 is a block diagram generally similar to FIG. 1 wherein the light sensors are directly connected together in a common polarity, parallel arrangement.

FIG. 2 illustrates a further photosensing system formed in accordance with the invention. The photosensing system embodiment of the invention illustrated in FIG. 2 comprises: a modulated light source 31; first and second light sensors 33 and 35; a cable 37; an input line preamplifier 39; and, a detector 41. Also illustrated is a detector output terminal 43 and an object 45. The light sensors 33 and 35 are photovotaic light sensors and are mounted such that light from the modulated light source 31 impinges on their photosensitive surface, unless such impingement is partially or fully prevented by the object 45. The outputs of the light sensors 33 and 35 are connected in parallel to one end of a pair of twisted wires 36 and 38 forming the cable 37. More specifically, the negative outputs of both of the light sensors 33 and 35 are connected to one wire 36 of the twisted wire pair forming the cable 37 and the positive outputs of both light sensors are connected to the associated end of the other wire 38.

The other end of the cable 37 is connected to the inputs of the input line preamplifier 39 and its output is connected to the input of the detector 41.

The only difference between the FIG. 2 photosensing system and FIG. 1 photosensing system is that the light sensors of the FIG. 2 photosensing system are connected to perform an OR logic-type (sum) function rather than an Exclusive OR logic-type (difference) function. That is, an input voltage is applied to the sensor end of the cable 37 if either or both of the light sensors receive light from the modulated light source. Only if neither light sensor receives light, is zero voltage applied.

It will be noted and appreciated that logic-type functions other than OR and Exclusive OR logic-type functions can be performed by other unbiased photosensing systems formed in accordance with the invention.

It also will be appreciated that the ability to use several sets of photosensors and in combination with one or more modulated light sources (LEDs) to perform logic functions has a number of advantages in machine control systems, particularly those wherein unusually dimensioned fields must be viewed. For example, several elements can be assembled to determine if a long thin, possibly curved, edge is accurately formed or positioned. Similarly, breaks or open defects in webbs or veneers can be accurately detected using a long thin modulated light source and several spaced light sensors.

While the photosensing systems illustrated in FIGS. 1 and 2 will generate voltages that are detectable by prior art types of balanced input line preamplifiers having input impedances greater than 1,000 ohms, if the cable 17 is short, i.e., several (15) feet, these voltages will be minimized by cable capacitance to the point where they cannot be readily detected by such preamplifiers if the cable is increased by an order of magnitude, i.e., to 150 feet. In other words, in short cable environments, the input line preamplifier can take the form of a conventional amplifier. In long cable environments either a balanced low impedance differential input line preamplifier of the type herein disclosed, or one having similar characteristics must be used. If one is not used, an amplifier local to the light sensors would have to be included, along with the attendant disadvantages of such an amplifier, discussed above.

It should be noted, and is pointed out here, that the systems illustrated in FIGS. 1 and 2 are merely exemplary of light source/light sensor arrangements and should not be construed as limiting. More specifically, the light source/light sensor arrangements illustrated in FIGS. 1 and 2 show the light source aligned with the light sensors. As an alternative, the light source could direct light toward a reflector or retroreflector that directs the light onto the photosensitive surface of the light sensor(s). Still further, the object could form a light redirecting reflector or retroreflector that, when appropriately positioned directs light from a source onto a light sensor's photosensitive surface.

Figure 3:
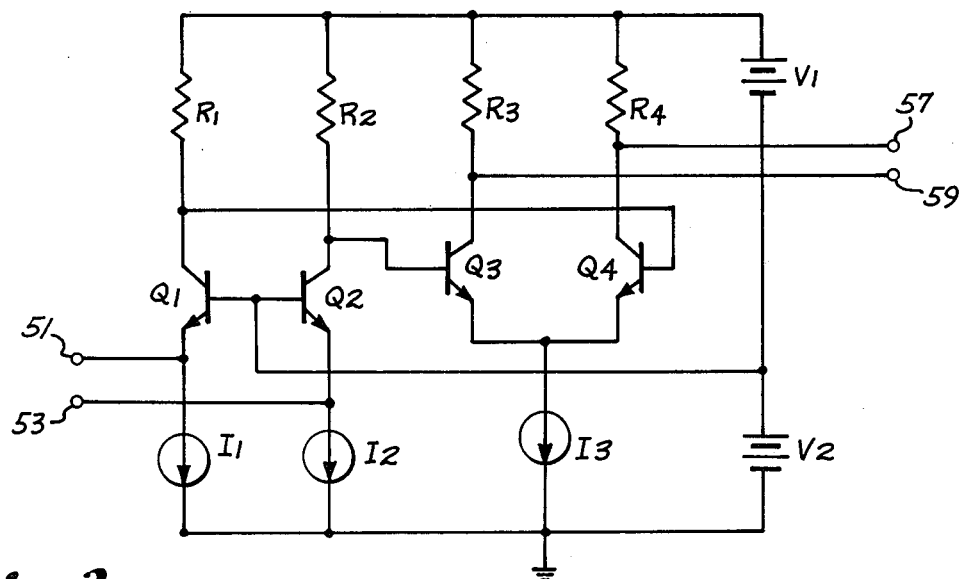
FIG. 3 is a schematic diagram of one embodiment of a balanced low impedance differential input line preamplifier formed in accordance with the invention.
Figure 4:
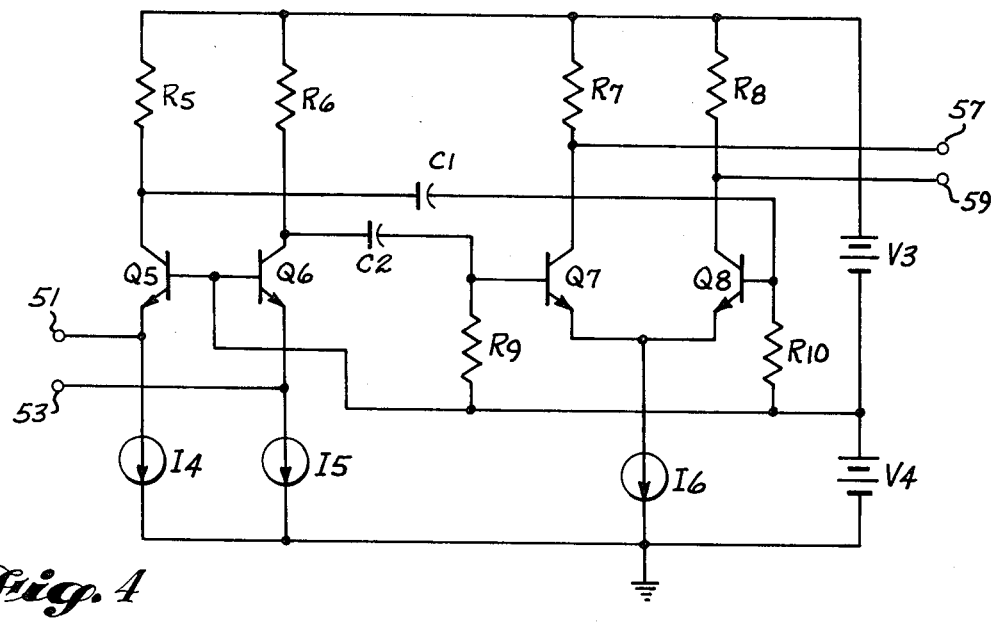
FIG. 4 is a block diagram of an alternate embodiment of a balanced low impedance differential input line preamplifier formed in accordance with the invention.
Figure 5:
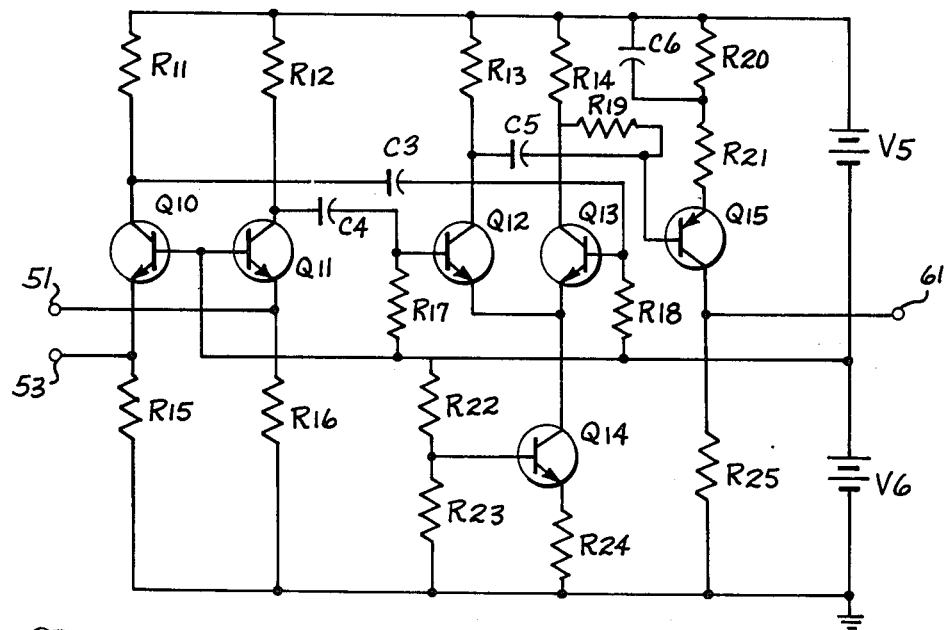
FIG. 5 is a further alternate embodiment of a balanced low impedance differential input line preamplifier formed in accordance with the invention.

FIGS. 3-5 illustrate balanced low impedance differential input line preamplifiers formed in accordance with the invention. In general, these circuits comprise a differential amplifier and a pair of common base input stages, one connected to each input of the differential amplifier. The common base input stages have low impedance, in the order of 1000 ohms or less, (necessary to minimize signal attenuation caused by cable capacitance) and the differential amplifier provides good common mode rejection, in the order of 40db or more, (necessary to reduce the effect of noise picked up by the cable). While it is desirable that the transistors used in these circuits be matched, transistor matching is not nearly as critical as is the case with common base differential amplifiers.

FIG. 3 illustrates a balanced low impedance differential input line preamplifier formed in accordance with the invention that comprises: four NPN transistors designated Q1, Q2, Q3 and Q4; four resistors designated R1, R2, R3 and R4; three current sources designated I1, I2, and I3, preferably formed by semiconductor elements; and, two DC voltage sources designated V1 and V2. R1, R2, R3 and R4 are connected between the positive terminal of V1 and the collectors of Q1, Q2, Q3 and Q4 respectively. The negative terminal of V1 is connected to the positive terminal of V2 and to the bases of Q1 and Q2. The emitter of Q1 is connected through I1 to the negative terminal of V2 (ground) and the emitter of Q2 is connected through I2 to ground. The junction between R1 and the collector of Q1 is connected to the base of Q4. The junction between R2 and the collector of Q2 is connected to the base of Q3. The emitters of Q3 and Q4 are connected through I3 to ground.

One of the twisted wires forming the cable 17 is connected via an input terminal 51 to the emitter of Q1. The other wire is connected via an input terminal 53 to the emitter of Q2. The collectors of Q3 and Q4, via output terminals 57 and 59, are connected to the detector 21.

In operation, transistors Q1 and Q2 provide a matched pair of common base amplifiers. Transistor Q1 is biased by base voltage V2 and current source I1. Similarly, transistor Q2 is biased by base voltage V2 and current source I2. If Q1 and Q2 are high gain transistors, the base current can be ignored and the collector currents of these transistors is essentially equal to their emitter currents. Therefore, the instantaneous collector current is equal to the constant bias current plus the instantaneous input current to the emitter of the respective transistor. If I1 and Q1 have the same general characteristics I2 and Q2, respectively, and R1 and R2 are matched, then the voltage on the collectors of Q1 and Q2 will be equal as long as the input currents to their emitters are equal.

Transistors Q3 and Q4 form a conventional emitter coupled differential amplifier. If Q3 and R3 and Q4 and R4 are matched and the amplifier is biased by a suitable current source I3, the amplifier will only respond to differences between the collector voltages of Q1 and Q2. Therefore, if a common mode input current is applied to Q1 and Q2, the common mode voltage produced on their collectors will be rejected by the differential amplifier. Conversely, a differential input current will produce a differential voltage that will be amplified by Q3 and Q4 and applied to the terminals 57 and 59.

FIG. 4 illustrates an alternate embodiment of a balanced low impedance differential input line preamplifier formed in accordance with the invention and comprises: four NPN transistors designated Q5, Q6, Q7 and Q8; six resistors designated R5, R6, R7, R8, R9 and R10; two capacitors designated C1 and C2; three current sources designated I4, I5 and I6; and, two DC voltage sources designated V3 and V4. The positive terminal of V3 is connected through R5, R6, R7 and R8 to the collectors Q5, Q6, Q7 and Q8, respectively. The negative terminal V3 is connected to the positive terminal V4 and to the bases of Q5 and Q6. The emitter of Q5 is connected through I4 to the negative terminal of V4 (ground) and the emitter of Q6 is connected through I5 to ground. The collector of Q5 is connected through C1 to the base of Q8 and the collector of Q6 is connected through C2 to the base of Q7. The base of Q7 is also connected through R9 to the junction between V3 and V4. The base of Q8 is also connected through R10 to the junction between V3 and V4. The emitters of Q7 and Q8 are connected through I6 to ground.

It will be appreciated that the circuit illustrated in FIG. 4 is generally similar to the circuit illustrated in FIG. 3, except that capacitors C1 and C2 provide DC decoupling between the common base input stages (formed by Q5 and Q6) and the differential amplifier (formed by Q7 and Q8). This decoupling arrangement reduces the matching requirements of I4 and I5 and Q5 and Q6, since differences in bias voltage will not be amplified by Q7 and Q8. The matching of the Q5 and Q6 collector resistors, R5 and R6, however, still remains critical, since any mismatch will result is different input gains and, thus, limit common mode rejection.

FIG. 5 illustrates a further embodiment of a balanced low impedance differential input line preamplifier formed in accordance with the invention and comprises: five NPN transistors designated Q10-Q14; a PNP transistor designated Q15; fifteen resistors designated R11-R25; four capacitors designated C3-C6; and, two DC voltage sources designated V5 and V6. The positive terminal of V5 is connected through R11, R12, R13 and R14 to the collectors of Q10, Q11, Q12 and Q13, respectively. The negative terminal of V5 is connected to the positive terminal of V6 and to the bases of Q10 and Q11. The emitter of Q10 is connected through R15 to the negative side of V6 (ground). The emitter of Q11 is connected through R16 to ground. The collector of Q10 is connected through C3 to the base of Q13 and the collector of Q11 is connected through C4 to the base of Q12. The bases of Q12 and Q13 are connected through R17 and R18, respectively to the junction between V5 and V6.

The collector of Q12 is connected to the collector of Q13 through C5 connected in series with R19. The junction between C5 and R19 is connected to the base of Q15. The emitter of Q15 is connected through R21 in series with R20 to the positive terminal of V5. C6 is connected in parallel with R20. The collector of Q15 is connected through R25 to ground. The emitters of Q12 and Q13 and connected to the collector of Q14. The emitter of Q14 is connected through R24 to ground. R22 and R23 are connected in parallel with V6. The junction between R22 and R23 is connected to the base of Q14.

As with the FIG. 4 embodiment of the balanced low impedance differential input line preamplifier, the FIG. 5 embodiment includes a pair of common base input stages (Q10 and Q11) capacitively connected (via C3 and C4) to the inputs of a differential amplifier (Q12 and Q13). The high frequency, common mode input current developed in the cable connected to input terminals 51 and 53 produces a common mode voltage on R11 and R12 which is coupled to the input of the differential amplifier by C3 and C4. This common mode signal is not amplified and does not appear on the collectors of Q12 and Q13. Resistors R17 and R18 provide base bias voltages for Q12 and Q13, as did R9 and R10 in the FIG. 4 embodiment, and R13 and R14 provide load resistors for Q12 and Q13.

Any high frequency differential voltage formed at the collectors of Q10 and Q11 is coupled to the bases of Q12 and Q13 and is amplified. This voltage appears as a differential output of the collectors of Q12 and Q13. This differential output is coupled to the base of Q15 via the C5/R19 series circuit. This circuit, in addition, creates a 90° phase-shift at the fundamental frequency, i.e., the frequency of modulation of the light source. In other words, the RC network formed by R19 and C5 phase shifts the output of the differential amplifier by 90°. This signal is amplified by Q15 prior to it being applied to an output terminal 61, connected to the collector Q15. In essence, Q15 forms the detector, or a portion thereof, illustrated in FIGS. 1 and 2.

Q14 provides a constant current source for the differential amplifier transistors, Q12 and Q13. R15 and R16 provide the desired bias current for Q10 and Q11; and, R22, R23 and R24 provide biasing for Q14. (It will be appreciated that suitably high values of resistance make R15 and R16 approximate constant surrent sources.) R20 and R21 form the emitter bias resistance for Q15; and, C6 bypasses R20 to increase the gain at the modulation signal frequency. R14 is the load resistor for Q6.

In addition to the benefits discussed above, i.e., low input impedance and common mode rejection, the balanced low impedance differential input line preamplifiers illustrated in FIGS. 3-5 have additional benefits, particularly in the area of power supply fluctuation rejection. More specifically, any ripple or noise in the power supply voltages will appear as common mode signals at the collectors of the common base transistors. Because such signals are common, they are not amplified by the differential amplifier transistors. Additionally, with respect to the FIG. 5 embodiment, the same ripple or noise will appear as a common mode signal at the collectors of Q12 and Q13 and, therefore, at the base of Q15. Since the emitter of Q15 is connected to the same power supply, the ripple does not appear at the output of Q15, i.e., at output terminal 61.

It will be appreciated that the balanced low impedance differential input line preamplifier illustrated in FIGS. 3-5 amplify low-level, high frequency signals of the type created on a long cable by the unamplified output of unbiased photovoltaic devices mounted to detect modulated light. The circuits have low impedance inputs and good common mode rejection. Thus, they are readily adapted to reduce the effects of cable capacitance (due to the low impedance) and discriminate against electrical noise picked up or generated by the cable (due to their common mode rejection characteristics).

In summary, the invention has a number of aspects. First, it provides photosensing systems adapted to utilize unbiased light detectors of a photovoltaic nature directly connected to perform comparing or logic-type functions, where the light sensors receive light from a modulated light source. In addition, the invention provides a photosensing system wherein low level currents created by a single, or a plurality of directly connected, photovoltaic devices can be transmitted via relatively long cables. This result is preferably accomplished by the inclusion of a novel balanced low impedance differential input line preamplifier.

While preferred embodiments of the invention have been illustrated and described, it will be appreciated that various changes can be made therein without departing from the spirit and scope of the invention. For example, the illustrated NPN transistors can be replaced by PNP transistors and vice versa, if desired. Or, other types of active elements, such as FETs can be used, further, additional comparison and logic-type functions can be performed in accordance with the invention, using different photosensor connections. Hence, the invention can be practiced otherwise than as specifically described herein.

The embodiments of the invention in which an exclusive property or privilege is claimed are defined as follows:

1. A balanced low impedance differential input line preamplifier having low input impedance and good common mode rejection comprising:
   a first common base input stage including a first high gain transistor having its emitter connected to directly receive a first input signal applied to said balanced low impedance differential input line preamplifier;
   a second common base stage including a second high gain transistor having its emitter connected to directly receive a second input signal applied to said balanced low impedance differential input line preamplifier, the base of said second high gain transistor connected to the base of said first high gain transistor;
   first constant current source means connected to the emitters of said first and second high gain transistors;
   a differential amplifier including third and fourth transistors connected together such that they produce an output signal related to the difference in the input signal applied to the bases of said third and fourth transistors;
   second constant current source means connected to the emitters of said third and fourth transistors;
   a first DC decoupling capacitor connected between the collector of said first high gain transistor and the base of said third transistor; and,
   a second DC decoupling capacitor connected between the collector of said second high gain transistor and the base of said fourth transistor.

2. A balanced low impedance differential input line preamplifier as claimed in claim 1 wherein said first constant current source means includes a first a constant current source connected to the emitter of said first transistor and a second constant current source connected to the emitter of said second transistor.

3. A balanced low impedance differential input line preamplifier as claimed in claim 2 wherein said first, second, third and fourth transistors are all NPN transistors.

4. A balanced low impedance differential input line preamplifier as claimed in claim 2 including:

a first bias source;

first, second, third and fourth resistors connected between said first bias source and the collectors of said first, second, third and fourth transistors, respectively; and, a second bias source connected to the base of said first and second transistors.

* * * * *